United States Patent [19]
Iketani

[11] Patent Number: 4,833,470
[45] Date of Patent: May 23, 1989

[54] CODE CONVERSION APPARATUS

[75] Inventor: Akira Iketani, Osaka, Japan

[73] Assignee: Matsushita Electric Industrial Co., Ltd., Japan

[21] Appl. No.: 73,443

[22] Filed: Jul. 14, 1987

[30] Foreign Application Priority Data

Jul. 15, 1986 [JP] Japan .................................. 61-165826
Feb. 19, 1987 [JP] Japan .................................. 62-36088
Mar. 19, 1987 [JP] Japan .................................. 62-64543

[51] Int. Cl.$^4$ ............................................ A03M 7/46
[52] U.S. Cl. ...................................... 341/59; 341/58; 341/95
[58] Field of Search .................. 340/347 DD; 360/40; 341/58, 59, 95

[56] References Cited

U.S. PATENT DOCUMENTS

| | | |
|---|---|---|
| 3,689,899 | 9/1972 | Franaszek . |
| 3,852,687 | 12/1974 | Hodges . |
| 4,486,739 | 12/1984 | Franaszek .................... 340/347 DD |
| 4,598,326 | 7/1986 | Leiner .................... 360/40 |
| 4,677,421 | 6/1987 | Taniyama .................... 340/347 DD |
| 4,688,016 | 8/1987 | Fok .............................. 340/347 DD |

Primary Examiner—William M. Shoop, Jr.
Assistant Examiner—Gary J. Romano
Attorney, Agent, or Firm—Lowe, Price, LeBlanc, Becker & Shur

[57] ABSTRACT

Each of data words has m bits. The m-bit data words are converted into corresponding n-bit code words. The n-bit code words are concatenated to form a bit sequence where the number of successive bits having a same binary value is limited to a range of a smaller value d to a larger value k. A code work W1 and also a following code word W2 are controlled to satisfy the limitation defined by the values d and k. The number of different code words forming an RLL code system is relatively large. For example, in respect of a first available RLL code word system, 8-bit data words are directly converted into 12-bit code words (Tw=0.667T) and the limitation defined by the values d and k equal to 2 and 10 respectively are satisfied. In respect of a second available RLL code word system, 6-bit data words are directly converted into 9-bit code words (Tw=0.667T) and the limitation defined by the values d and k equal to 2 and 23 respectively are satisfied.

10 Claims, 3 Drawing Sheets

CODE CONVERSION APPARATUS

BACKGROUND OF THE INVENTION

1. Field of the Invention

This invention relates to a code conversion apparatus producing run-length limited codes suitable for recording digital signals.

2. Description of the Prior Art

In case where digital data are recorded in magnetic tapes or discs at high densities, run-length limited codes (referred to as RLL codes hereinafter) are generally used. In an RLL code system, m-bit data words are converted into respective n-bit code words, which are concatenated to form a bit sequence where the number of successive bits having the same binary value is limited to a range of a smaller value d to a larger value k.

RLL codes suitable for high density recording are generally required to satisfy the following three known conditions.

[1] The detection window width $Tw$ ($=m/n \cdot T$) is wide, where the letter T denotes the one-bit length of a data word.

[2] The minimal inversion interval $Tmin$ ($=d \cdot Tw$) is large.

[3] The maximal successive bit number k is small.

As the detection window width Tw increases, variations in the time axis, such as jitters or peak shifts, less affect the rate of errors in coding during reproduction or playback process. As the minimal inversion interval Tmin increases, high-frequency component cut-off characteristics of recording and reproducing systems less affect qualities of reproduced digital signals. As the maximal successive bit number k decreases, it is easier to obtain self clock function deriving clock information from a reproduced or playback signal. Since the detection window width and the minimal inversion interval greatly affect recording and reproducing characteristics, they are important.

Heretofore, various RLL codes have been developed. U.S. Pat. No. 3,689,899 discloses ⅔ codes which are one type of RLL codes. In these ⅔ codes, the values d, k, and Tw are equal to 2, 9, and 0.667 T respectively. The ⅔ codes constitute variable length RLL codes which change between a first state where 2-bit data words are converted into 3-bit code words and a second state where 4-bit data words are converted into 6-bit code words.

Although the ⅔ codes satisfy the previously-mentioned desired conditions [1]–[3], the ⅔ codes have problems as follows. The ⅔ codes use both the ⅔ conversion and the 4/6 conversion. Therefore, during the code conversion of 8-bit digital video data, a boundary or pause between data words sometimes extends over two words of video data. In this case, if an error occurs in a code word, this error spreads or expands over the two words of the video data during decoding. It should be noted that one word of video data has 8 bits.

Although the ⅔ RLL codes are used to prevent an increase in the rate of decoding errors in high density recording, the use of the ⅔ codes cause expansions of decoding errors in some cases since the ⅔ codes are of the variable length. Especially, in the case of video tape recorders for personal or family use, the density of recording is generally set high to allow a long recording. Accordingly, decoding errors are liable to occur during play back process, and expansions of errors frequently occur when the ⅔ RLL codes are used.

U.S. Pat. No. 3,852,687 discloses 8/13 codes which have the largest detection window width among conventional RLL codes allowing direct code conversion of 8-bit data words and having the value d equal to 2. The detection window width of the 8/13 codes equals 0.615 T and is smaller than the detection window width of the ⅔ codes. In general, the smaller detection window width deteriorates the recording and reproducing characteristics and also increases the error rate.

SUMMARY OF THE INVENTION

It is an object of this invention to provide a reliable code conversion apparatus.

It is another object of this invention to provide a code conversion apparatus allowing an acceptably low error rate.

In a code conversion apparatus of this invention, both of successive code words W1 and W2 are controlled to satisfy desired limitations on the values d and k. Accordingly, the number of different code words constituting an RLL code system is increased so that an excellent RLL code system can be obtained.

For example, the code conversion apparatus of this invention produces RLL codes by directly converting 8-bit data words into 12-bit code words ($Tw=0.667$ T). The produced RLL codes satisfy the following limitations on the values d and k: $d=2$, $k=10$. These RLL codes prevent expansions of errors.

DESCRIPTION OF THE FIRST PREFERRED EMBODIMENT

Figure 2:
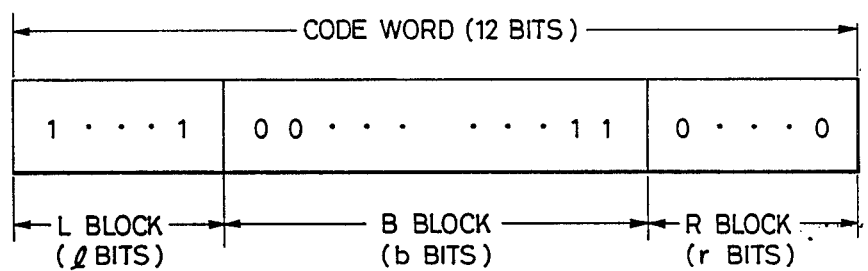
FIG. 2 is a diagram of the structure of a code word.

A code conversion apparatus according to a first embodiment of this invention produces and uses RLL codes having values m, n, d, and k equal to 8, 12, 2, and 10 respectively. Accordingly, in the RLL code system used in this embodiment, 8-bit data words are converted into 12-bit code words, which are concatenated to form a bit sequence where the number of successive bits having the same binary values is limited to a range of 2 to 10. The limitation defined by the values d and k will be referred to as the d-k limitation hereinafter. For the sake of description, parameters composed of an L block, a B block, and an R block are defined to classify code words. As shown in FIG. 2, the L block consists of an l-bit start portion of a code word where the same binary value TB successively occurs. The R block consists of an r-bit end portion of the code word where the same binary value LB successively occur. The B block consists of a b-bit intermediate portion of the code word between the start and end portions of the code word, where the bit number b equals $12-l-r$.

The code words used in this embodiment satisfy the following conditions:

[I] The bit numbers l and r are in the range of 1 to 9.

[II] The B block completely satisfies the d-k limitation. In other words, in the B block, the number of successive bits having the same binary value is always in the range of 2 to 10.

In cases where the bit number b is different from 0, the condition [II] means that the binary value 0 occurs in successive bits whose number is in the range of the value d to the value k and the binary value 1 occurs in successive bits whose number is in the range of the value d to the value k in an alternate manner in the B block. In respect of the bit numbers l and r, parameters F and E are defined as follows:

F=0 (l=1)
F=1 (l is in the range of 2 to 5)
F=2 (l is in the range of 6 to 9)
E=0 (r=1)
E=1 (r is in the range of 2 to 5)
E=2 (r is in the range of 6 to 9)

Figure 3:
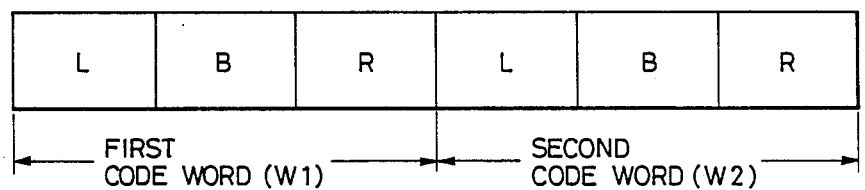
FIG. 3 is a diagram of concatenated code words.

Concatenations between code words are controlled on the basis of the previously defined parameters TB, F, E, and LB. In respect of the concatenation between successive code words W1 and W2 o FIG. 3, this control is designed so that a concatenated portion composed of the R block of the first code word W1 and the L block of the second code word W2 satisfies the d-k limitation. The rules of the concatenation between the code words are referred to as the concatenation rules.

Table 1 shows code word combination or group rules in this embodiment which are defined on the basis of the previously-mentioned parameters TB, F, E, and LB. In Table 1, the character CW-No. denotes a code word combination or group number and an identification number of a code word in a group. Code words in a group or combination correspond to a common data word.

In Table 1, the parameters TB, F, E, and LB relate to code words, and examples of code words represented by these parameters are listed.

following description, a code word A' has an inverted pattern with respect to the pattern of a code word A and thus results from the changes of the digital vaues 1 and 0 of the code word A.

[G1] A code word CW(F, E, 1) having the values F and E not equal to 1 and the values TB and LB equal to 1, the inverted code word CW(F, E, 1)' the code word CW(F, E, 0) having the same values F, E, and TB as those of the code word CW(F, E, 1) and having the value LB equal to 0, and the inverted code word CW(F, E, 0)' are combined to form a common group (see CW-No. =1, 4, and 13 of Table 1).

[G2] A code word CW(F, 1, X) having he value F not equal to 1 and the values E and TB equal to 1, and the inverted code word CW(F, 1, X)' are combined to form a common group (see CW-No. =2, 3, 14, and 15 of Table 1). The letter X denotes either of 0 and 1.

[G3] A code word CW(1, E, )) having the values F, TB, and LB equal to 1 and having the value E different from 1, and the code word CW(1, E, 0) having the same values F, E, and TB as those of the code word CW(1, E, 1) and having the value LB equal to 0 are combined to form a commonn group (see CW-No. =5, 6, 11, and 12 of Table 1).

[G4] Code words CW(1, 1, X) having the values F and E equal to 1 form different groups having single members respectively. Also, the inverted code words CW(1, 1, X)' form different groups having signal members respectively (see CW-No. =7, 8, 9, and 10 of Table 1).

According to the previously-mentioned rules [G1]–[G4] of code word combinations or groups, as shown in Table 2, the d-k limitation is always satisfied even when code words are concatenated. With reference to Table 2, in the case of a code word group containing a code word whose final bit equals 0 and a code word whose final bit equals 1, it is necessary that the

TABLE 1

| CW-No. | TB | F | E | LB | EXAMPLE (d = 2, k = 10) |
|---|---|---|---|---|---|
| 1.1 | 0 | 0 | 0 | 0 | 0 1 1 . . . . . . 1 1 0 |
| 1.2 | 0 | 0 | 0 | 1 | 0 1 1 . . . . . . 0 0 1 |
| 1.3 | 1 | 0 | 0 | 0 | 1 0 0 . . . . . . 1 1 0 |
| 1.4 | 1 | 0 | 0 | 1 | 1 0 0 . . . . . . 0 0 1 |
| 2.1 | 0 | 0 | 1 | 0 | 0 1 1 . . 1 1 0 0 0 0 0 |
| 2.2 | 1 | 0 | 1 | 1 | 1 0 0 . . 0 0 1 1 1 1 1 |
| 3.1 | 0 | 0 | 1 | 1 | 0 1 1 . . 0 0 1 1 1 1 1 |
| 3.2 | 1 | 0 | 1 | 0 | 1 0 0 . . 1 1 0 0 0 0 0 |
| 4.1 | 0 | 0 | 2 | 0 | 0 1 1 0 0 0 0 0 0 0 0 0 |
| 4.2 | 0 | 0 | 2 | 1 | 0 1 1 0 0 1 1 1 1 1 1 1 |
| 4.3 | 1 | 0 | 2 | 0 | 1 0 0 1 1 1 1 1 1 1 1 1 |
| 4.4 | 1 | 0 | 2 | 1 | 1 0 0 1 1 0 0 0 0 0 0 0 |
| 5.1 | 0 | 1 | 0 | 0 | 0 0 0 0 0 1 1 . . 1 1 0 |
| 5.2 | 0 | 1 | 0 | 1 | 0 0 0 0 0 1 1 . . 0 0 1 |
| 6.1 | 1 | 1 | 0 | 0 | 1 1 1 1 1 0 0 . . 1 1 0 |
| 6.2 | 1 | 1 | 0 | 1 | 1 1 1 1 1 0 0 . . 0 0 1 |
| 7 | 0 | 1 | 1 | 0 | 0 0 0 0 0 1 1 0 0 0 0 0 |
| 8 | 0 | 1 | 1 | 1 | 0 0 0 1 1 1 1 0 0 0 1 1 |
| 9 | 1 | 1 | 1 | 0 | 1 1 0 0 0 0 1 1 0 0 0 0 |
| 10 | 1 | 1 | 1 | 1 | 1 1 1 1 1 0 0 0 1 1 1 1 |
| 11.1 | 0 | 1 | 2 | 0 | 0 0 1 1 0 0 0 0 0 0 0 0 |
| 11.2 | 0 | 1 | 2 | 1 | 0 0 1 1 0 0 1 1 1 1 1 1 |
| 12.1 | 1 | 1 | 2 | 0 | 1 1 1 0 0 0 0 0 0 0 0 0 |
| 12.2 | 1 | 1 | 2 | 1 | 1 1 1 0 0 1 1 1 1 1 1 1 |
| 13.1 | 0 | 2 | 0 | 0 | 0 0 0 0 0 0 0 0 0 1 1 0 |
| 13.2 | 0 | 2 | 0 | 1 | 0 0 0 0 0 0 0 1 1 0 0 1 |
| 13.3 | 1 | 2 | 0 | 0 | 1 1 1 1 1 1 0 0 1 1 0 |
| 13.4 | 1 | 2 | 0 | 1 | 1 1 1 1 1 1 1 1 0 0 1 |
| 14.1 | 0 | 2 | 1 | 0 | 0 0 0 0 0 0 0 1 1 0 0 |
| 14.2 | 1 | 2 | 1 | 1 | 1 1 1 1 1 1 1 1 0 0 1 1 |
| 15.1 | 0 | 2 | 1 | 1 | 0 0 0 0 0 0 0 1 1 1 1 |
| 15.2 | 1 | 2 | 1 | 1 | 1 1 1 1 1 1 1 1 0 0 0 0 |

The code word combination or group rules of Table 1 will be described in more detail hereinafter. In the value of a selection parameter S is defined as being equal to 0 or 1 to select one of the code words. In the case of other code word groups, it is unnecessary to define the value of the selection parameter S and thus the value S is denoted by the character "-".

In the case of 12-bit code words satisfying the previously-mentioned conditions [I] and [II], the number of different code word combinations or groups obtained through the rules [G1]-[G4] is 264 as shown in Tables 3A-3G. It should be noted that inverted code words are omitted from Tables 3A-3G. In Tables 3A-3G, the character DP denotes the absolute value of the disparity of a code word, that is, the absolute value of the difference between the number of bits having binary values equal to 1 and the number of bits having binary values equal to 0 in a code word.

TABLE 2

| PARAMETER | | | | | EXAMPLE (d = 2, k = 10) | |
|---|---|---|---|---|---|---|
| E | LB | F | Y | S | FIRST CODE WORD | SECOND CODE WORD |
| 0 | 0 | 0 | 1 | — | . . . . . . . . . . . . | 1 1 0 0 1 1 . . . . . . |
| 0 | 1 | 0 | 0 | — | . . . . . . . . . . . . | 0 0 1 1 0 0 . . . . . . |
| 0 | 0 | 1 | 0 | 0 | . . . . . . . . . . . . | 1 1 0 0 0 0 0 0 1 1 . . |
| 0 | 1 | 1 | 0 | 1 | . . . . . . . . . . . . | 0 0 1 1 1 1 1 1 0 0 . . |
| 0 | 0 | 2 | 1 | — | . . . . . . . . . . . . | 1 1 0 0 0 0 0 0 0 0 1 1 |
| 0 | 1 | 2 | 0 | — | . . . . . . . . . . . . | 0 0 1 1 1 1 1 1 1 1 0 0 |
| 1 | 0 | 0 | 1 | — | . . . . . . 1 1 0 0 | 0 0 0 0 0 1 . . . . . . |
| 1 | 1 | 0 | 0 | — | . . . . . . 0 0 1 1 | 1 1 1 1 0 0 . . . . . . |
| 1 | 0 | 1 | 0 | — | . . . . . . 1 1 0 0 | 0 0 0 1 1 1 1 0 0 . . . |
| 1 | 0 | 1 | 0 | — | . . . . . . 1 1 0 0 | 0 0 0 0 0 0 0 1 1 . . . |
| 1 | 1 | 1 | 0 | — | . . . . . . 0 0 1 1 | 1 1 1 1 1 1 1 0 0 . . . |
| 1 | 1 | 1 | 0 | — | . . . . . . 0 0 1 1 | 1 1 1 1 0 0 0 0 1 1 . . |
| 1 | 0 | 2 | 0 | — | . . . . . . 1 1 0 0 | 0 0 0 1 1 1 1 1 1 1 0 0 |
| 1 | 1 | 2 | 1 | — | . . . . . . 0 0 1 1 | 1 1 1 0 0 0 0 0 0 0 1 1 |
| 2 | 0 | 0 | 1 | — | . 1 1 0 0 0 0 0 0 0 0 | 0 0 0 1 . . . . . . . . |
| 2 | 1 | 0 | 0 | — | . 0 0 1 1 1 1 1 1 1 1 | 1 1 1 0 0 . . . . . . . |
| 2 | 0 | 1 | 0 | 0 | . 1 1 0 0 0 0 0 0 0 0 | 0 1 1 1 1 0 0 . . . . . |
| 2 | 1 | 1 | 0 | 1 | . 0 0 1 1 1 1 1 1 1 1 | 1 0 0 0 0 1 1 . . . . . |
| 2 | 0 | 2 | 0 | — | . 1 1 0 0 0 0 0 0 0 0 | 0 1 1 1 1 1 1 1 1 0 0 . |
| 2 | 1 | 2 | 1 | — | . 0 0 1 1 1 1 1 1 1 1 | 1 0 0 0 0 0 0 0 0 1 1 . |

TABLE 3A

| No. | CODE WORD | DP |
|---|---|---|
| 1 | 111100110000 | 0 |
| 2 | 111001110000 | 0 |
| 3 | 111100011000 | 0 |
| 4 | 111000111000 | 0 |
| 5 | 110011110000 | 0 |
| 6 | 111100001100 | 0 |
| 7 | 110001111000 | 0 |
| 8 | 111000011100 | 0 |
| 9 | 110011001100 | 0 |
| 10 | 110000111100 | 0 |
| 11 | 110011100000 | 2 |
| 12 | 111100001110 | 2 |
| 13 | 111001100000 | 2 |
| 14 | 111001111000 | 2 |
| 15 | 111000011000 | 2 |
| 16 | 111100011000 | 2 |
| 17 | 111000110000 | 2 |
| 18 | 111000111100 | 2 |
| 19 | 110000111000 | 2 |
| 20 | 111110011000 | 2 |
| 21 | 110011111000 | 2 |
| 22 | 111000001100 | 2 |
| 23 | 111110001100 | 2 |
| 24 | 110001110000 | 2 |
| 25 | 110001111100 | 2 |
| 26 | 110000011100 | 2 |
| 27 | 110000011000 | 4 |
| 28 | 110000110000 | 4 |
| 29 | 111110011100 | 4 |
| 30 | 110001100000 | 4 |
| 31 | 111100111100 | 4 |
| 32 | 111001111100 | 4 |
| 33 | 110011111100 | 4 |

TABLE 3A-continued

| No. | CODE WORD | DP |
|---|---|---|
| 34 | 110000001100 | 4 |
| 35 | 110000001111 | 0 |
| 36 | 111000000111 | 0 |
| 37 | 111100000011 | 0 |
| 38 | 110001100011 | 0 |
| 39 | 110011000011 | 0 |
| 40 | 110000110011 | 0 |
| 41 | 111110000111 | 2 |
| 42 | 110011000111 | 2 |
| 43 | 111001100011 | 2 |
| 44 | 110001100111 | 2 |
| 45 | 111000110011 | 2 |
| 46 | 110000000111 | 2 |
| 47 | 111000000011 | 2 |
| 48 | 110011100011 | 2 |
| 49 | 111110000011 | 2 |
| 50 | 110001110011 | 2 |
| 51 | 110000011111 | 2 |
| 52 | 111000001111 | 2 |
| 53 | 111100001111 | 4 |
| 54 | 111110000111 | 4 |
| 55 | 111000011111 | 4 |
| 56 | 110011001111 | 4 |
| 57 | 111001100111 | 4 |
| 58 | 110011100111 | 4 |
| 59 | 111001110011 | 4 |
| 60 | 110011110011 | 4 |

TABLE 3B

| No. | CODE WORD | DP |
|---|---|---|
| 61 | 111100110011 | 4 |
| 62 | 110000000011 | 4 |
| 63 | 111100011111 | 6 |
| 64 | 111110001111 | 6 |
| 65 | 000011001111 | 0 |
| 66 | 000110001111 | 0 |
| 67 | 000011100111 | 0 |
| 68 | 000111000111 | 0 |
| 69 | 001100001111 | 0 |
| 70 | 000011110011 | 0 |
| 71 | 001110000111 | 0 |
| 72 | 000111100011 | 0 |
| 73 | 001100110011 | 0 |
| 74 | 001111000011 | 0 |
| 75 | 001100011111 | 2 |
| 76 | 000011100011 | 2 |
| 77 | 000110011111 | 2 |
| 78 | 000110000111 | 2 |
| 79 | 001111100011 | 2 |
| 80 | 000011000111 | 2 |

TABLE 3B-continued

| No. | CODE WORD | DP |
|---|---|---|
| 81 | 0 0 0 1 1 1 0 0 1 1 1 1 | 2 |
| 82 | 0 0 0 1 1 1 0 0 0 0 1 1 | 2 |
| 83 | 0 0 1 1 1 1 0 0 0 1 1 1 | 2 |
| 84 | 0 0 0 0 0 1 1 0 0 1 1 1 | 2 |
| 85 | 0 0 1 1 0 0 0 0 0 1 1 1 | 2 |
| 86 | 0 0 0 1 1 1 1 1 0 0 1 1 | 2 |
| 87 | 0 0 0 0 0 1 1 1 0 0 1 1 | 2 |
| 88 | 0 0 1 1 1 0 0 0 1 1 1 1 | 2 |
| 89 | 0 0 1 1 1 0 0 0 0 0 1 1 | 2 |
| 90 | 0 0 1 1 1 1 0 0 1 1 0 0 | 2 |
| 91 | 0 0 1 1 1 1 1 0 0 1 1 1 | 4 |
| 92 | 0 0 1 1 1 1 0 0 1 1 1 1 | 4 |
| 93 | 0 0 0 0 0 1 1 0 0 0 1 1 | 4 |
| 94 | 0 0 1 1 1 0 0 1 1 1 1 1 | 4 |
| 95 | 0 0 0 0 1 1 0 0 0 0 1 1 | 4 |
| 96 | 0 0 0 1 1 0 0 0 0 0 1 1 | 4 |
| 97 | 0 0 1 1 0 0 0 0 0 0 1 1 | 4 |
| 98 | 0 0 1 1 1 1 1 1 0 0 1 1 | 4 |
| 99 | 0 0 1 1 1 1 1 1 0 0 0 0 | 0 |
| 100 | 0 0 0 1 1 1 1 1 1 0 0 0 | 0 |
| 101 | 0 0 0 0 1 1 1 1 1 1 0 0 | 0 |
| 102 | 0 0 1 1 1 0 0 1 1 1 0 0 | 0 |
| 103 | 0 0 1 1 0 0 1 1 1 1 0 0 | 0 |
| 104 | 0 0 1 1 1 1 0 0 1 1 0 0 | 0 |
| 105 | 0 0 0 0 1 1 1 1 1 0 0 0 | 2 |
| 106 | 0 0 1 1 0 0 1 1 1 0 0 0 | 2 |
| 107 | 0 0 0 1 1 0 0 1 1 0 0 0 | 2 |
| 108 | 0 0 1 1 1 0 0 1 1 0 0 0 | 2 |
| 109 | 0 0 0 1 1 1 0 0 1 1 0 0 | 2 |
| 110 | 0 0 1 1 1 1 1 1 1 0 0 0 | 2 |
| 111 | 0 0 0 1 1 1 1 1 1 1 0 0 | 2 |
| 112 | 0 0 1 1 0 0 0 1 1 1 0 0 | 2 |
| 113 | 0 0 0 0 0 1 1 1 1 1 0 0 | 2 |
| 114 | 0 0 1 1 1 0 0 0 1 1 0 0 | 2 |
| 115 | 0 0 1 1 1 1 1 1 0 0 0 0 | 2 |
| 116 | 0 0 0 1 1 1 1 1 0 0 0 0 | 2 |
| 117 | 0 0 0 0 1 1 1 1 0 0 0 0 | 4 |
| 118 | 0 0 0 0 0 1 1 1 1 0 0 0 | 4 |
| 119 | 0 0 0 1 1 1 1 0 0 0 0 0 | 4 |
| 120 | 0 0 1 1 0 0 1 1 0 0 0 0 | 4 |

TABLE 3C

| No. | CODE WORD | DP |
|---|---|---|
| 121 | 0 0 0 1 1 0 0 1 1 0 0 0 | 4 |
| 122 | 0 0 1 1 0 0 0 1 1 0 0 0 | 4 |
| 123 | 0 0 0 1 1 0 0 0 1 1 0 0 | 4 |
| 124 | 0 0 1 1 0 0 0 0 1 1 0 0 | 4 |
| 125 | 0 0 0 0 1 1 0 0 1 1 0 0 | 4 |
| 126 | 0 0 1 1 1 1 1 1 1 1 0 0 | 4 |
| 127 | 0 0 0 0 1 1 1 0 0 0 0 0 | 6 |
| 128 | 0 0 0 0 0 1 1 1 0 0 0 0 | 6 |
| 129 | 1 0 0 1 1 1 1 1 1 0 0 0 | 0 |
| 130 | 1 0 0 0 1 1 1 1 1 0 0 0 | 0 |
| 131 | 1 0 0 1 1 0 0 1 1 1 0 0 | 0 |
| 132 | 1 0 0 1 1 1 0 0 1 1 0 0 | 0 |
| 133 | 1 0 0 0 0 1 1 1 1 0 0 0 | 2 |
| 134 | 1 0 0 0 1 1 1 1 0 0 0 0 | 2 |
| 135 | 1 0 0 1 1 1 1 1 1 0 0 0 | 2 |
| 136 | 1 0 0 1 1 1 1 0 0 0 0 0 | 2 |
| 137 | 1 0 0 1 1 0 0 0 1 1 0 0 | 2 |
| 138 | 1 0 0 1 1 0 0 1 1 0 0 0 | 2 |
| 139 | 1 0 0 0 1 1 0 0 1 1 0 0 | 2 |
| 140 | 1 0 0 0 0 1 1 1 1 0 0 0 | 2 |
| 141 | 1 0 0 0 0 1 1 1 1 1 0 0 | 2 |
| 142 | 1 0 0 0 1 1 1 1 1 1 0 0 | 2 |
| 143 | 1 0 0 0 0 0 1 1 1 0 0 0 | 4 |
| 144 | 1 0 0 0 1 1 1 0 0 0 0 0 | 4 |
| 145 | 1 0 0 0 0 1 1 1 0 0 0 0 | 4 |
| 146 | 1 0 0 0 0 0 0 1 1 1 0 0 | 4 |
| 147 | 1 0 0 1 1 1 1 1 1 1 0 0 | 4 |
| 148 | 1 0 0 0 0 0 1 1 0 0 0 0 | 6 |
| 149 | 1 0 0 0 0 1 1 0 0 0 0 0 | 6 |
| 150 | 1 0 0 0 0 0 0 1 1 0 0 0 | 6 |
| 151 | 1 0 0 0 0 0 0 0 1 1 0 0 | 6 |
| 152 | 1 0 0 0 0 0 0 1 1 1 1 1 | 0 |
| 153 | 1 0 0 0 1 1 0 0 0 1 1 1 | 0 |
| 154 | 1 0 0 1 1 0 0 0 0 1 1 1 | 0 |
| 155 | 1 0 0 0 0 1 1 0 0 1 1 1 | 0 |

TABLE 3C-continued

| No. | CODE WORD | DP |
|---|---|---|
| 156 | 1 0 0 0 1 1 1 0 0 0 1 1 | 0 |
| 157 | 1 0 0 1 1 1 0 0 0 0 1 1 | 0 |
| 158 | 1 0 0 0 0 1 1 1 0 0 1 1 | 0 |
| 159 | 1 0 0 0 1 1 0 0 1 1 1 1 | 2 |
| 160 | 1 0 0 0 0 0 0 0 1 1 1 1 | 2 |
| 161 | 1 0 0 1 1 1 0 0 0 1 1 1 | 2 |
| 162 | 1 0 0 1 1 0 0 0 1 1 1 1 | 2 |
| 163 | 1 0 0 1 1 1 1 0 0 0 1 1 | 2 |
| 164 | 1 0 0 0 1 1 0 0 0 0 1 1 | 2 |
| 165 | 1 0 0 0 1 1 1 1 0 0 1 1 | 2 |
| 166 | 1 0 0 0 0 1 1 0 0 1 1 1 | 2 |
| 167 | 1 0 0 0 1 1 1 0 0 1 1 1 | 2 |
| 168 | 1 0 0 1 1 0 0 0 0 0 1 1 | 2 |
| 169 | 1 0 0 0 0 0 1 1 0 0 1 1 | 2 |
| 170 | 1 0 0 1 1 1 1 0 0 1 1 1 | 4 |
| 171 | 1 0 0 1 1 0 0 1 1 1 1 1 | 4 |
| 172 | 1 0 0 0 0 0 0 0 0 1 1 1 | 4 |
| 173 | 1 0 0 1 1 1 1 1 1 0 1 1 | 4 |
| 174 | 1 0 0 1 1 1 0 0 1 1 1 1 | 4 |
| 175 | 1 0 0 0 0 0 0 0 0 0 1 1 | 6 |
| 176 | 1 1 1 1 1 1 1 0 0 0 0 0 | 2 |
| 177 | 1 1 1 1 1 1 0 0 1 1 0 0 | 4 |
| 178 | 1 1 1 1 1 1 1 1 0 0 0 0 | 4 |
| 179 | 1 1 1 1 1 1 1 1 1 0 0 0 | 6 |
| 180 | 1 1 1 1 1 1 0 0 0 0 1 1 | 4 |

TABLE 3D

| No. | CODE WORD | DP |
|---|---|---|
| 181 | 1 1 1 1 1 1 1 0 0 0 1 1 | 6 |
| 182 | 1 1 1 1 1 1 0 0 0 1 1 1 | 6 |

| No. | CODE WORD 1 | DP | CODE WORD 2 | DP |
|---|---|---|---|---|
| 183 | 1 1 1 1 0 0 0 0 0 1 1 0 | 0 | 1 1 1 1 1 0 0 0 0 0 0 1 | 0 |
| 184 | 1 1 1 0 0 0 1 1 0 1 1 0 | 0 | 1 1 1 0 0 0 1 1 0 0 0 1 | 0 |
| 185 | 1 1 0 0 1 1 0 0 0 1 1 0 | 0 | 1 1 1 0 0 1 1 0 0 0 0 1 | 0 |
| 186 | 1 1 0 0 0 1 1 0 0 1 1 0 | 0 | 1 1 1 0 0 0 0 1 1 0 0 1 | 0 |
| 187 | 1 1 0 0 0 0 0 1 1 1 1 0 | 0 | 1 1 0 0 0 1 1 1 0 0 0 1 | 0 |
| 188 | 1 1 1 1 0 0 0 0 1 1 1 0 | 2 | 1 1 0 0 1 1 1 0 0 0 0 1 | 0 |
| 189 | 1 1 1 0 0 0 0 0 1 1 1 0 | 2 | 1 1 0 0 0 0 1 1 1 0 0 1 | 0 |
| 190 | 1 1 0 0 1 1 0 0 1 1 1 0 | 2 | 1 1 1 1 0 0 0 1 1 0 0 1 | 2 |
| 191 | 1 1 1 1 1 0 0 0 0 1 1 0 | 2 | 1 1 1 1 0 0 0 0 0 0 0 1 | 2 |
| 192 | 1 1 0 0 1 1 1 0 0 1 1 0 | 2 | 1 1 1 0 0 1 1 1 0 0 0 1 | 2 |
| 193 | 1 1 1 0 0 1 1 0 0 1 1 0 | 2 | 1 1 1 0 0 0 0 1 1 0 0 1 | 2 |
| 194 | 1 1 0 0 0 0 1 1 1 1 1 0 | 2 | 1 1 0 0 1 1 1 0 0 0 0 1 | 2 |
| 195 | 1 1 1 0 0 0 0 1 1 1 1 0 | 2 | 1 1 0 0 0 1 1 0 0 0 0 1 | 2 |
| 196 | 1 1 0 0 0 0 0 1 1 1 1 0 | 2 | 1 1 0 0 0 1 1 1 1 0 0 1 | 2 |
| 197 | 1 1 1 1 1 0 0 0 1 1 1 0 | 4 | 1 1 0 0 0 0 1 1 0 0 0 1 | 2 |
| 198 | 1 1 1 1 0 0 0 1 1 1 1 0 | 4 | 1 1 1 0 0 0 1 1 1 0 0 1 | 2 |
| 199 | 1 1 0 0 0 1 1 1 1 1 1 0 | 4 | 1 1 0 0 1 1 0 0 0 0 0 1 | 2 |
| 200 | 1 1 1 0 0 0 1 1 1 1 1 0 | 4 | 1 1 0 0 0 0 0 1 1 0 0 1 | 2 |
| 201 | 1 1 0 0 1 1 0 0 0 1 1 0 | 4 | 1 1 1 0 0 1 1 1 1 0 0 1 | 4 |
| 202 | 1 1 1 1 1 0 0 1 1 1 1 0 | 6 | 1 1 1 1 1 0 0 1 1 0 0 1 | 4 |
| 203 | 1 1 1 0 0 1 1 1 1 1 1 0 | 6 | 1 1 1 0 0 0 0 0 0 0 0 1 | 4 |
| 204 | 1 1 0 0 1 1 1 1 1 1 1 0 | 6 | 1 1 0 0 1 1 1 1 1 0 0 1 | 4 |
| 205 | 1 1 1 1 0 0 1 1 1 1 1 0 | 6 | 1 1 1 1 0 0 1 1 1 0 0 1 | 4 |
| 206 | 0 0 0 0 1 1 1 1 1 0 0 1 | 0 | 0 0 0 0 0 1 1 1 1 1 1 0 | 0 |
| 207 | 0 0 0 1 1 1 1 1 0 0 0 1 | 0 | 0 0 0 1 1 1 0 0 1 1 1 0 | 0 |

TABLE 3E

| No. | CODE WORD 1 | DP | CODE WORD 2 | DP |
|---|---|---|---|---|
| 208 | 0 0 1 1 0 0 1 1 1 0 0 1 | 0 | 0 0 0 1 1 0 0 1 1 1 1 0 | 0 |
| 209 | 0 0 1 1 0 0 1 1 0 0 0 1 | 0 | 0 0 0 1 1 1 1 0 0 1 1 0 | 0 |
| 210 | 0 0 1 1 1 1 1 0 0 0 0 1 | 0 | 0 0 1 1 1 0 0 0 1 1 1 0 | 0 |
| 211 | 0 0 0 0 1 1 1 1 0 0 0 1 | 2 | 0 0 1 1 0 0 0 1 1 1 1 0 | 0 |
| 212 | 0 0 0 1 1 1 1 1 1 0 0 1 | 2 | 0 0 1 1 1 1 0 0 0 1 1 0 | 0 |
| 213 | 0 0 1 1 0 0 1 1 1 0 0 1 | 2 | 0 0 0 0 1 1 1 0 0 1 1 0 | 2 |
| 214 | 0 0 0 0 0 1 1 1 1 0 0 1 | 2 | 0 0 0 0 1 1 1 1 1 1 1 0 | 2 |
| 215 | 0 0 1 1 0 0 0 1 1 0 0 1 | 2 | 0 0 0 1 1 0 0 1 1 1 1 0 | 2 |
| 216 | 0 0 0 1 1 0 0 1 1 0 0 1 | 2 | 0 0 0 0 1 1 0 0 1 1 1 0 | 2 |
| 217 | 0 0 1 1 1 1 0 0 0 0 0 1 | 2 | 0 0 1 1 0 0 0 0 1 1 1 0 | 2 |
| 218 | 0 0 0 1 1 1 1 0 0 0 0 1 | 2 | 0 0 1 1 1 0 0 0 0 1 1 0 | 2 |
| 219 | 0 0 1 1 1 1 1 0 0 0 0 1 | 2 | 0 0 1 1 1 0 0 0 0 1 1 0 | 2 |
| 220 | 0 0 0 0 0 1 1 1 0 0 0 1 | 4 | 0 0 1 1 1 1 0 0 1 1 1 0 | 2 |
| 221 | 0 0 0 0 1 1 1 0 0 0 0 1 | 4 | 0 0 0 0 1 1 1 0 0 1 1 0 | 2 |
| 222 | 0 0 1 1 1 0 0 0 0 0 0 1 | 4 | 0 0 1 1 0 0 1 1 1 1 1 0 | 2 |
| 223 | 0 0 0 1 1 1 0 0 0 0 0 1 | 4 | 0 0 1 1 1 1 1 0 0 1 1 0 | 2 |

TABLE 3E-continued

| No. | CODE WORD 1 | DP | CODE WORD 2 | DP |
|---|---|---|---|---|
| 224 | 001111111001 | 4 | 000110000110 | 4 |
| 225 | 000001100001 | 6 | 000001100110 | 4 |
| 226 | 000110000001 | 6 | 000111111110 | 6 |
| 227 | 001100000001 | 6 | 001100000110 | 4 |
| 228 | 000011000001 | 6 | 000011000110 | 4 |
| 229 | 111110000000 | 2 | 110000111111 | 4 |
| 230 | 111100000000 | 4 | 111000111111 | 6 |
| 231 | 110011000000 | 4 | 110001111111 | 6 |
| 232 | 000001111111 | 2 | 001111000000 | 4 |
| 233 | 000011111111 | 4 | 000011000000 | 6 |
| 234 | 001100111111 | 4 | 001110000000 | 6 |
| 235 | 100110001110 | 0 | 100110011001 | 0 |
| 236 | 100111000110 | 0 | 100011110001 | 0 |
| 237 | 100011001110 | 0 | 100111100001 | 0 |

TABLE 3F

| No. | CODE WORD 1 | DP | CODE WORD 2 | DP |
|---|---|---|---|---|
| 238 | 100011100110 | 0 | 100001111001 | 0 |
| 239 | 100000111110 | 0 | 100011100001 | 2 |
| 240 | 100111001110 | 2 | 100001110001 | 2 |
| 241 | 100110011110 | 2 | 100111000001 | 2 |
| 242 | 100110000110 | 2 | 100111110001 | 2 |
| 243 | 100111100110 | 2 | 100011111001 | 2 |
| 244 | 100001100110 | 2 | 100000111001 | 2 |
| 245 | 100011000110 | 2 | 100001110000 | 4 |
| 246 | 100001111110 | 2 | 100000110000 | 4 |
| 247 | 100000011110 | 2 | 100011000001 | 4 |
| 248 | 100011111110 | 4 | 100110000001 | 4 |
| 249 | 100000001110 | 4 | 100111111001 | 4 |
| 250 | 100111111110 | 6 | 100000011001 | 4 |
| 251 | 100111000000 | 4 | 100000111111 | 2 |
| 252 | 100110000000 | 6 | 100001111111 | 4 |
| 253 | 100011000000 | 6 | 100011111111 | 6 |
| 254 | 111111000110 | 4 | 111111000001 | 2 |
| 255 | 111111001110 | 6 | 111111100001 | 4 |
| 256 | 111111100110 | 6 | 111111110001 | 6 |

TABLE 3G

| No. | CODE WORD | DP |
|---|---|---|
| 257 | 111110011111 | 8 |
| 258 | 000001100000 | 8 |
| 259 | 111111001111 | 8 |
| 260 | 111111100111 | 8 |
| 261 | 111111110011 | 8 |

| No. | CODE WORD 1 | DP | CODE WORD 2 | DP |
|---|---|---|---|---|
| 262 | 111000000000 | 6 | 110011111111 | 8 |
| 263 | 000111111111 | 6 | 001100000000 | 8 |
| 264 | 100000000110 | 6 | 100000000001 | 8 |

Since the number of different 8-bit data words is 256, all the data words can be converted into different code words according to the 12-bit RLL code system in this embodiment which satisfies that the values d and k are equal to 2 and 10 respectively.

In usual digital recording, blocks each having a plurality of data are formed and synchronous patterns are added to the respective blocks to perform block synchronization. Synchronous patterns are chosen from special patterns which will not occur in a coded sequence obtained via code conversion of data words.

In this embodiment, the code words having absolute disparities DP equal to or smaller than 6 are chosen to correspond to data words. In this embodiment, the series concatenation of two same code words having a disparity equal to 8 is used as a synchronous pattern. For example, the code word No. 257 in Table 3G is used for a synchronous pattern.

Figure 4:
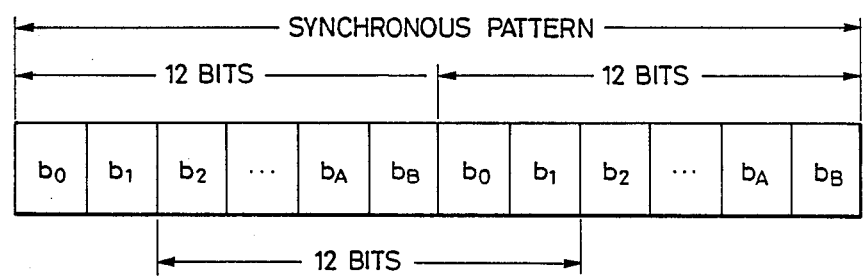
FIG. 4 is a diagram of a synchronous pattern.

As shown in FIG. 4, any set of successive 12 bits in a 24-bit synchronous pattern contains bits forming a code word having a disparity DP equal to 8, so that the disparity DP of any set of successive 12 bits in the synchronous pattern equals 8. In addition, a 24-bit synchronous pattern contains at least one code word having 12 bits. Any 24-bit sequence resulting from the concatenation of code words having disparities equal to or smaller than 6 and thus corresponding to data words differs from a synchronous pattern.

The previously-mentioned choice of the code words corresponding to data words and the code words forming synchronous patterns ensures that block synchronization is properly performed while the values d and k are kept equal to 2 and 10 respectively.

Figure 1:
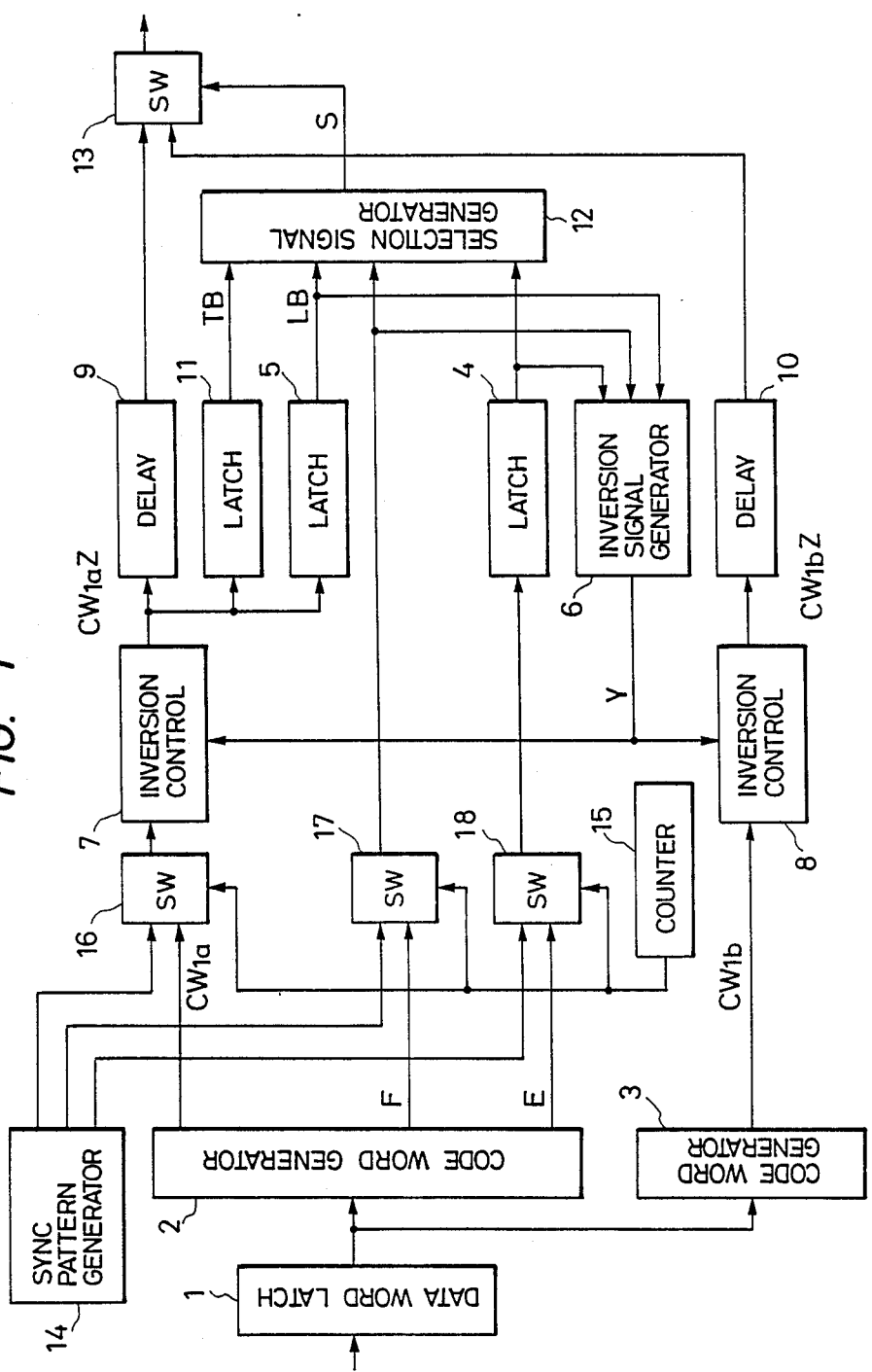
FIG. 1 is a block diagram of a code conversion apparatus according to a first embodiment of this invention.

As shown in FIG. 1, the code conversion apparatus includes a data word latch 1 which sequantially holds periodically-transmitted 8-bit data word signals. An output terminal of the data word latch 1 is connected to input terminals of code word generators 2 and 3 so that the 8-bit data word signals are successively transmitted from the data word latch 1 to the code word generators 2 and 3. The devices 2 and 3 generate 12-bit signals representing code words in a group corresponding to the inputted data word. Specifically, the device 2 generates code words CW(F, E, 0) having the value TB equal to 1 where F=0,1,2 and E=0,1,2, code words CW(1, E, 0) having the value TB equal to 0 where E=0,1,2, and parameters F and E related to L and R blocks of these generated code words. The code word outputted by the generator 2 is denoted by the character CWia. The device 3 generates code words CW(F, E, 1) having the value TB equal to 1 where F=0,1,2 and E=0,2, code words CW(1, E, 1) having the value TB equal to 0 where E=0,2. The code word outputted by the generator 3 is denoted by the character CWib. The code words CWia and CWib are outputted in serial form..

The code words CWia and CWib are in common group (see Table 1) corresponding to the inputted data word and have same binary values TB forming L blocks thereof. In the case of a group containing a code word A having a value TB equal to 1 and an inverted code word A', only the code word A is generated. The code words in groups (see Table 1) containing single members respectively are generated by the code word generator 2.

A latch 4 is connected to the code word generator 2 via a switch 18. A latch 5 is connected to the code word generator 2 via a switch 16 and an inversion controller 7. The latches 4 and 5 hold signals representing the values of the parameters E and LB related to an R block of a first or preceding code word W1. Since the value LB equals the value of the end bit of the code word, the end bit value is preferably used as the value LB.

An inversion control signal generator 6 is connected to the latches 4 and 5, and is also connected to the code word generator 2 via a switch 17. The device 6 generates a signal representing a value Y controlling a second code word W2 in accordance with Table 2. Specifically, when the value Y equals 1, the second code word W2 is inverted. When tee value Y equals 0, the second code word W2 is unchanged.

The inversion controller 7 is connected to the code word generator 2 via the switch 16 and is connected to the inversion control signal generator 6. The inversion controller 7 outputs a signal representing a code word CWiaZ which equals a code word CWia(Y=0) or an inverted code word CW'ia(Y=1) in accordance with the value Y. An inversion controller 8 is connected to the code word generator 3 and the inversion control signal generator 6. The inversion controller 8 outputs a signal representing a code word CWibZ which equals a code word CWib(Y=0) or an inverted code word CW'ib(Y=1) in accordance with the value Y. The combination of the code word generators 2 and 3, and the inversion controllers 7 and 8 can produce any one of member code words in a group corresponding to the inputted data word. It should be noted that the largest number of member code words in groups is 4 and that two members of 4 member groups are inverted code words with respect to the other two members (see Table 1).

The inversion controller 7 is connected to a 12-bit delay circuit 9. The signal representing the code word CWiaZ is transmitted to the delay circuit 9. The inversion controller 8 is connected to a 12-bit delay circuit 10. The signal representing the code word CWibZ is transmitted to the delay circuit 10.

A latch 11 connected to the inversion controller 7 holds the start bit value TB of the code word CWiaZ. A selection signal generator 12 is connected to the latches 4, 5, and 11. The selection signal generator 12 is also connected to the code word generator 2 via the switch 17. The device 12 generates a signal representing a value S determined in accordance with the parameter TB outputted from the latch 11, the parameter F related to an L block of a second code word W2 or code word CWia which is outputted from the code word generator 2, the parameter E related to an R block of a first or preceding code word W1 which is outputted from the latch 4, and the parameter LB related to the R block of the first or preceding code word W1 which is outputted from the latch 5. As will be made clear hereinafter, the value S is used in controlling signal selection. The determination of the value S in accordance with the parameters TB, LB, E, and F is performed by referring to Table 2. Specifically, when the output from the latch 9 should be selected as a first code word W1, the value S is set equal to 0 by referring to Table 2. When the output from the latch 10 should be selected as a first code word W1, the value S is set equal to by referring to Table 2.

A selector or switch 13 is connected to the latches 9 and 10, and the selection signal generator 12. When the value S equals 0, the switch 13 selects and passes the output of the delay circuit 9. When the value S equals 1, the switch 13 selects and passes the output of the delay circuit 10. In cases where the parameter S is denoted by the character "—" in Table 2, the selection signal is controlled to allow the switch 13 to select the output of the delay circuit 9. Thus, the selector 13 outputs a signal representing a code word CW(i−1)Z which equals the code word CW(i−1)aZ or the code word CW(i−1)bZ. As understood from the previous description, a code word is selected from a group corresponding to the inputted data word. Selection of a first code word is controlled in accordance with a second code word following the first code word. Also, selection of a second code word is controlled in accordance with a first code word preceding the second code word. This two-way control of code words ensures that a bit sequence formed by concatenating code words satisfies the d-k limitation. Accordingly, code words are selected from groups (see Tables 1 and 3A-3G) corresponding to the inputted data words and the selected code words are concatenated in accordance with Table 2.

A synchronous pattern generator 14 outputs a signal representing a 2-word (24-bit) synchronous pattern, a signal representing a value F equal to 1, and a signal representing a value E equal to 1. The synchronous pattern generator 14 is connected to the switches 16, 17, and 18. The signals representing the synchronous pattern, the value F, and the value E are applied to the switch 16, the switch 17, and the switch 18 respectively. A counter 15 connected to the switches 16–18 outputs a synchronous pattern interval signal thereto. When the synchronous pattern interval signal assumes an ON state, the switches 16–18 select and pass the signals outputted from the synchronous generator 14. When the synchronous pattern interval signal assumes an OFF state, the switches 16–18 select and pass the signals outputted from the code word generator 2. As a result, a synchronous pattern is handled in a manner similar to a code word having the values E and F equal to 1. Accordingly, the inversion of a synchronous pattern is prevented, and the d-k limitation is maintained even in segments before and after the synchronous pattern.

As described previously, the apparatus of FIG. 1 converts 8-bit data words into 12-bit code words, and then concatenate 12-bit code words to form a bit sequence. In this bit sequence, the number of successive bits having the same binary values is limited to a range of 2 to 10.

A decoder deriving 8-bit data words from 12-bit code words will be described hereinafter. In a conventional way of decoding, it is generally necessary to directly decode 12-bit signals into 8-bit data words. In the case where this decoding process is performed by a read-only memory (ROM), the necessary capacity of the ROM is $2^{1} \times 8$ bits approximately equal to 32 kbits. As will be made clear hereinafter, the necessary capacity of a ROM in a decoder of this embodiment is approximately 8.6 kbits.

Figure 5:
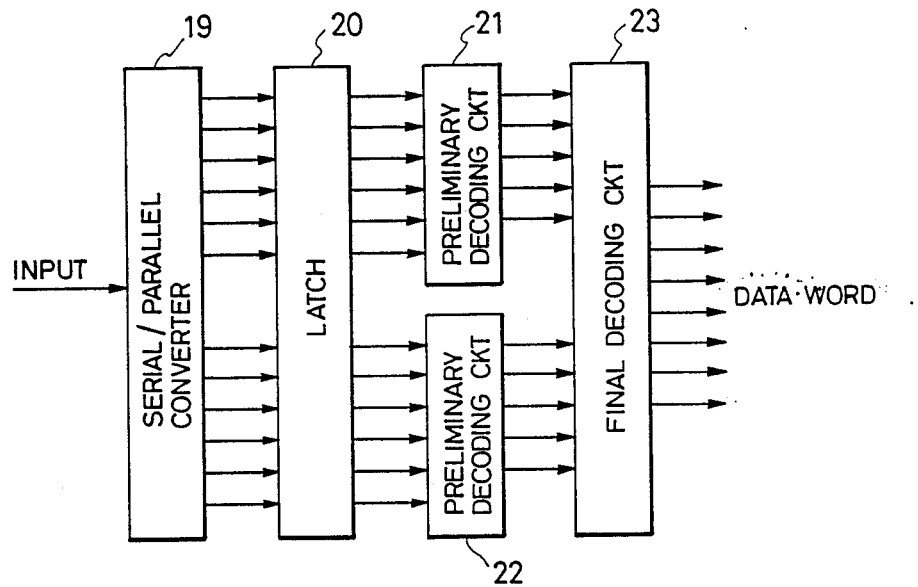
FIG. 5 is a block diagram of a decoder for an 8/12 code in the first embodiment of this invention.

FIG. 5 shows a decoder of this invention. As shown in FIG. 5, the decoder includes a serial-to-parallel converter 19 receiving a bit sequence. The device 19 converts the bit sequence into parallel data. A latch 20 connected to the serial-to-parallel converter 19 holds an output from the converter 19 in unit of a code word. Accordingly, a 12-bit code word is outputted from the latch 20. Then, the 12-bit code word is divided into two parts each having 6 bits.

The number of different bit patterns of the former 6 bits of 12-bit code words in Table 1 having absolute disparities DP equal to or smaller than 6 is 26 as shown in Table 4. These bit patterns can be discriminated or identified by use of 5 bits. A preliminary decoding circuit 21 connected to the latch 20 receives the former 6 bits of a 12-bit code word outputted by the latch 20. The preliminary decoding circuit 21 outputs a 5-bit identification number corresponding to the received former 6 bits of the 12-bit code word.

Similarly, the number of different bit patterns of the latter 6 bits of 12-bit code words in Table 1 having absolute disparities DP equal to or smaller than 6 is 26 as shown in Table 4. These bit patterns can be discriminated or identified by use of 5 bits. A preliminary decoding circuit 22 connected to the latch 20 receives the latter 6 bits of a 12-bit code word outputted by the latch 20. The preliminary decoding circuit 22 outputs a 5-bit identification number corresponding to the received latter 6 bits of the 12-bit code word.

TABLE 4

| No. | CODE WORD |
|---|---|
| 1 | 1 0 0 1 1 1 |
| 2 | 0 1 1 0 0 0 |

TABLE 4-continued

| No. | CODE WORD |
|-----|-----------|
| 3   | 1 1 0 0 1 1 |
| 4   | 0 0 1 1 0 0 |
| 5   | 1 1 1 0 0 1 |
| 6   | 0 0 0 1 1 0 |
| 7   | 1 0 0 0 1 1 |
| 8   | 0 1 1 1 0 0 |
| 9   | 1 1 0 0 0 1 |
| 10  | 0 0 1 1 1 0 |
| 11  | 1 0 0 1 1 0 |
| 12  | 0 1 1 0 0 1 |
| 13  | 1 0 0 0 0 1 |
| 14  | 0 1 1 1 1 0 |
| 15  | 1 0 0 0 0 0 |
| 16  | 0 1 1 1 1 1 |
| 17  | 1 1 0 0 0 0 |
| 18  | 0 0 1 1 1 1 |
| 19  | 1 1 1 0 0 0 |
| 20  | 0 0 0 1 1 1 |
| 21  | 1 1 1 1 0 0 |
| 22  | 0 0 0 0 1 1 |
| 23  | 1 1 1 1 1 0 |
| 24  | 0 0 0 0 0 1 |
| 25  | 1 1 1 1 1 1 |
| 26  | 0 0 0 0 0 0 |

A final decoding circuit 23 connected to the preliminary decoding circuits 21 and 22 receives the 5-bit signals from the circuits 21 and 22. The 5-bit signals are merely combined to form a 10-bit signal which represents an identification number for the 12-bit code word. The final decoding circuit 23 determines and outputs an 8-bit data word corresponding to the 10-bit signal.

In the case where the decoding circuits 21–23 basically consist of a ROM, the necessary capacity of the ROM for the preliminary decoding circuits 21 and 22 is $2 \times (2^6 \times 5)$ bits approximately equal to 600 bits and the necessary capacity of the ROM for the final decoding circuit 23 is $2^{10} \times 8$ bits approximately equal to 8 kbits. The total necessary capacity of the ROM is about 8,600 bits which approximately equals a quarter of the total necessary capacity of the ROM in the conventional decoder.

As understood from the previous description, in the embodiment of this invention, a simple system obtains RLL codes, suitable for high density recording, by directly converting 8-bit data words into 12-bit code words. These RLL codes have the values Tw, d, and k equal to 0.667 T, 2, and 10 respectively. In connection with coding of 8-bit digital data, an error in one word is prevented from spreading over two words during decoding. Accordingly, the rate of decoding errors in the embodiment of this invention can be lowered relative to the rates of decoding errors in the conventional systems.

In the embodiment of this invention, the d-k limitation is reliably satisfied and wrong synchronous patterns are completely prevented from occurring, so that perfect block synchronization is obtained. The two-stage decoding processes composed of the preliminary and final decoding processes in the embodiment of this invention can lower the necessary capacity of a ROM to a value equal to a quarter of the necessary capacity of the ROM in a conventional way of decoding.

DESCRIPTION OF THE SECOND PREFERRED EMBODIMENT

A second embodiment of this invention is similar to the first embodiment of this invention except for design changes described hereinafter.

A code conversion apparatus according to a second embodiment of this invention produces and uses an RLL code system having values m, n, d, and k equal to 6, 9, 2, and 12 respectively. The code words used in this embodiment satisfy the following conditions: [III]The value l is in the range of 1 to 9. The value r is in the range of 1 to 6. [IV]The block B completely satifies the d-k limitation. With respect to the values l and r, parameters F and E ar defined as follows:

$F = 0$ (l = 1)

$F = 1$ (l is in the range of 2 to 6)

$F = 2$ (l is equal to or greater than 7)

$E = 0$ (r = 1)

$E = 1$ (r is in the range of 2 to 6)

The rules of the combination and concatenation of code words are similar to those in the first embodiment.

In the case of 9-bit code words satisfying the previously-mentioned conditions [III]and [I]], the number of different code word combinations or groups obtained through the rules [G1]–[G4] is 65 as shown in Tables 5 A and 5 B. It should be noted that Tables 5 A and 5 B show examples of code word groups, and code words may be grouped in any manner as long as the combination rules [G1]–[G4] are satisfied.

Since the number of different 6-bit data words is 64, the RLL code system of this embodiment allows all the 6-bit data words to be coded. The code conversion apparatus of this embodiment is similar to the code conversion apparatus of FIG. 1 except that the bit number of data words and the bit number of code words are changed to 6 and 9 respectively.

A decoder deriving 6-bit data words from 9-bit code words will be described hereinafter. In a conventional way of decoding, the necessary capacity of a ROM is $2^9 \times 6$ bits approximately equal to 3 kbits. As will be made clear hereinafter, the necessary capacity of a ROM in a decoder of this embodiment is approximately 1.6 kbits.

TABLE 5A

| No. | CODE WORD | No. | CODE WORD |
|-----|-----------|-----|-----------|
| 1  | 1 1 1 0 0 1 1 0 0 | 26 | 1 1 0 0 0 1 1 1 1 |
| 2  | 1 1 0 0 1 1 1 0 0 | 27 | 1 1 1 0 0 0 1 1 1 |
| 3  | 1 1 1 1 1 0 0 0 0 | 28 | 1 1 1 1 0 0 0 1 1 |
| 4  | 1 1 0 0 0 0 1 1 1 | 29 | 0 0 0 1 1 1 1 1 1 |
| 5  | 1 1 1 1 0 0 0 1 1 | 30 | 1 0 0 0 1 1 1 1 1 |
| 6  | 0 0 1 1 0 0 1 1 1 | 31 | 1 1 1 0 0 0 0 0 0 |
| 7  | 0 0 1 1 1 0 0 1 1 | 32 | 0 0 0 0 0 0 1 1 1 |
| 8  | 0 0 0 0 1 1 1 1 1 | 33 | 0 0 1 1 1 0 0 0 0 |
| 9  | 0 0 1 1 1 1 1 0 0 | 34 | 0 0 0 1 1 1 0 0 0 |
| 10 | 1 0 0 1 1 1 1 0 0 | 35 | 0 0 0 0 1 1 1 0 0 |
| 11 | 1 0 0 0 0 1 1 1 1 | 36 | 1 0 0 1 1 0 0 0 0 |
| 12 | 1 0 0 1 1 0 0 1 1 | 37 | 1 0 0 0 1 1 0 0 0 |
| 13 | 1 1 0 0 1 1 0 0 0 | 38 | 1 0 0 0 0 1 1 0 0 |
| 14 | 1 1 0 0 0 1 1 0 0 | 39 | 1 0 0 0 0 0 0 1 1 |
| 15 | 1 1 1 1 0 0 0 0 0 | 40 | 1 1 1 1 0 0 1 1 1 |
| 16 | 1 1 0 0 0 0 0 1 1 | 41 | 1 1 1 1 1 0 0 1 1 |
| 17 | 0 0 0 1 1 0 0 1 1 | 42 | 1 1 0 0 1 1 1 1 1 |
| 18 | 0 0 1 1 0 0 0 1 1 | 43 | 1 1 1 0 0 1 1 1 1 |
| 19 | 0 0 0 0 0 1 1 1 1 | 44 | 1 0 0 1 1 1 1 1 1 |
| 20 | 0 0 1 1 1 1 0 0 0 | 45 | 1 1 1 1 1 1 1 0 0 |
| 21 | 0 0 0 1 1 1 1 0 0 | 46 | 0 0 0 0 0 1 1 0 0 |
| 22 | 1 0 0 1 1 1 0 0 0 | 47 | 0 0 0 0 0 1 1 0 0 |
| 23 | 1 0 0 0 1 1 1 0 0 | 48 | 0 0 1 1 0 0 0 0 0 |
| 24 | 1 0 0 0 0 0 1 1 1 | 49 | 0 0 0 1 1 0 0 0 0 |
| 25 | 1 1 1 1 1 1 0 0 0 |    |           |

TABLE 5B

| No. | CODE WORD 1 | CODE WORD 2 |
|---|---|---|
| 50 | 1 1 1 0 0 0 1 1 0 | 1 1 1 1 0 0 0 0 1 |
| 51 | 1 1 0 0 0 0 1 1 0 | 1 1 0 0 1 1 0 0 1 |
| 52 | 0 0 1 1 1 0 0 0 1 | 0 0 0 1 1 1 1 1 0 |
| 53 | 1 0 0 0 0 1 1 1 0 | 1 0 0 1 1 1 0 0 1 |
| 54 | 1 1 0 0 0 1 1 1 0 | 1 1 1 0 0 0 0 0 1 |
| 55 | 0 0 0 1 1 1 0 0 1 | 0 0 0 0 1 1 1 1 0 |
| 56 | 0 0 1 1 1 1 0 0 1 | 0 0 1 1 0 0 1 1 0 |
| 57 | 1 0 0 0 1 1 1 1 0 | 1 0 0 1 1 0 0 0 1 |
| 58 | 1 1 1 0 0 1 1 1 0 | 1 1 1 1 1 0 0 0 1 |
| 59 | 0 0 1 1 0 0 0 0 1 | 0 0 1 1 1 1 1 1 0 |
| 60 | 1 0 0 1 1 1 1 1 0 | 1 0 0 0 1 1 0 0 1 |
| 61 | 1 1 0 0 1 1 1 1 0 | 1 1 0 0 0 0 0 0 1 |
| 62 | 0 0 0 1 1 0 0 0 1 | 0 0 0 0 0 1 1 1 0 |
| 63 | 1 1 1 1 0 0 1 1 0 | 1 1 1 1 1 1 0 0 1 |
| 64 | 0 0 0 0 1 1 0 0 1 | 0 0 0 0 0 0 1 1 0 |
| 65 | 1 0 0 0 0 0 1 1 0 | 1 0 0 0 0 0 0 0 1 |

Figure 6:
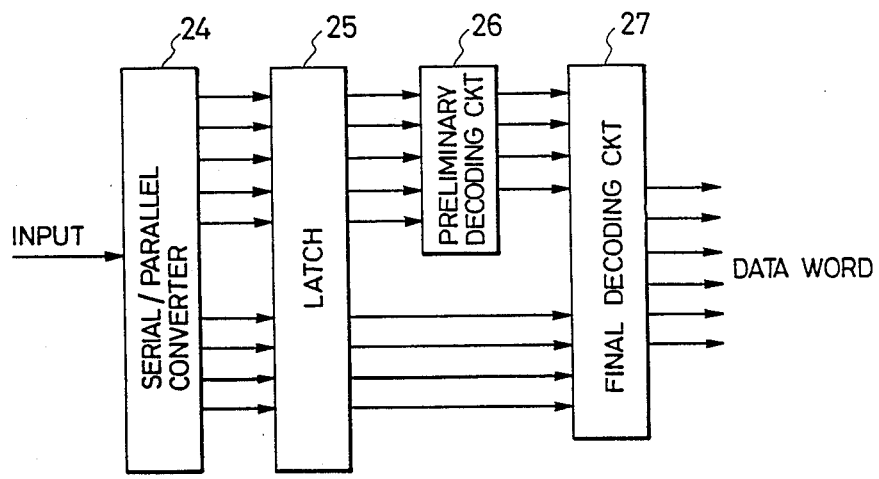
FIG. 6 is a block diagram of a decoder for a 6/9 code in a second embodiment of this invention.

FIG. 6 shows a decoder of this embodiment. As shown in FIG. 6, the decoder includes a serial-to-parallel converter 24 receiving a bit sequence. The device 24 converts the bit sequence into parallel data. A latch 25 connected to the serial-to-parallel converter 24 holds an output from the converter 24 in unit of a code word. Accordingly, a 9-bit code word is outputted from the latch 25. Then, the 9-bit code word is divided into two parts having 5 bits and 4 bits respectively.

The number of different bit patterns of the former 5 bits of 9-bit code words is 16 as shown in Table 6. These bit patterns can be discriminated or identified by use of 4 bits. A preliminary decoding circuit 26 connected to the latch 25 receives the former 5 bits of a 9-bit code word outputted by the latch 25. The preliminary decoding circuit 26 outputs a 4-bit identification number corresponding to the received former 5 bits of the 9-bit code word.

A final decoding circuit 27 connected to the latch 25 and the preliminary decoding circuit 26 receives the 4-bit signals from the circuits 25 and 26. The 4-bit signals are merely combined to form an 8-bit signal which represents an identification number for the 9-bit code word. The final decoding circuit 27 determines and outputs an 6-bit data word corresponding to the 8-bit signal.

TABLE 6

| No. | CODE WORD |
|---|---|
| 1 | 1 0 0 0 0 |
| 2 | 0 1 1 1 1 |
| 3 | 1 0 0 0 1 |
| 4 | 0 1 1 1 0 |
| 5 | 1 0 0 1 1 |
| 6 | 0 1 1 0 0 |
| 7 | 1 1 0 0 0 |
| 8 | 0 0 1 1 1 |
| 9 | 1 1 0 0 1 |
| 10 | 0 0 1 1 0 |
| 11 | 1 1 1 0 0 |
| 12 | 0 0 0 1 1 |
| 13 | 1 1 1 1 0 |
| 14 | 0 0 0 0 1 |
| 15 | 1 1 1 1 1 |
| 16 | 0 0 0 0 0 |

In the case where the decoding circuits 26 and 27 basically consist of a ROM, the necessary capacity of the ROM for the preliminary decoding circuit 26 is $2^5 \times 4$ bits equal to 128 bits and the necessary capacity of the ROM for the final decoding circuit 27 is $2^8 \times 6$ bits approximately equal to 1.5 kbits. The total necessary capacity of the ROM is about 1,600 bits which approximately equal a half of the total necessary capacity of the ROM in the conventional decoding system.

As understood from the previous description, in the embodiment of this invention, a simple system obtains RLL codes, suitable for high density recording, by directly converting 6-bit data words into 9-bit code words. These RLL codes have the values Tw, d, and k equal to 0.667 T, 2, and 12 respectively. In connection with coding of 6-bit digital data, an error in one word is prevented from spreading over two words during decoding. Accordingly, the rate of decoding errors in the embodiment of this invention can be lowered relative to the rates of decoding errors in the conventional systems.

The two-stage decoding processes composed of the preliminary and final decoding processes in the embodiment of this invention can lower the necessary capacity of a ROM to a value approximately equal to a half of the necessary capacity of the ROM in a conventional way of decoding.

It should be noted that although NRZL recording is premised on the previous description of this invention, this invention can be applied to other recoding such as NRZI recording.

What is claimed is:

1. A code conversion apparatus for generating run length limited codes wherein m-bit data words are converted into n-bit code words which are concatenated to form a bit sequence where a number of successive bits having a same binary value is limited to a range of a smaller value d to a larger value k, the apparatus comprising:
   (a) means for classifying the code words into groups corresponding to the respective data words, wherein each of the groups includes at least one code word and any code words in respective different groups are different from each other; and
   (b) means for correcting selection of a code word W1 from a group containing the code word W1 in accordance with only selection of a code word W2, following the code word W1, from a group containing the code word W2.

2. A code coversion apparatus for generating run length limited codes wherein m-bit data words are converted into n-bit code words which are concatenated to form a bit sequence where a number of successive bits having a same binary value is limited to a range of a smaller value d to a larger value k, the apparatus comprising:
   (a) first generation means for generating an n-bit code word W2a corresponding to an inputted m-bit data word;
   (b) second generation mean for generating an n-bit code word W2b corresponding to the inputted m-bit data word;
   (c) first replacement means for replacing the code word W2a by a code word W2a' in accordance with information related to a code word W1 preceding the code word W2 and with information related to the code word W2a, wherein the code word W2a' is precombined with the code word W2a;
   (d) second replacement means for replacing the code word W2b by a code word W2b' precombined with the code word W2b;
   (e) first delay means for delaying the code word W2a or 22a';

(f) second delay means for delaying the code word W2b or W2b'; and (g) means for selecting one of code words outputted from the first and second delay means in accordance with information related to the code word outputted from the first delay mean and with information related to the code word W2a outputted from the first generation means.

3. The apparatus of claim 2 wherein the values d, k, m, and n are equal to 2, 10, 8, and 12 respectively.

4. The apparatus of claim 2 wherein the values d, k, m, and n are equal to 2, 12, 6, and 9 respectively.

5. The apparatus of claim 2 wherein output of the selecting means consists of the output from the first generation means when there is a single code word corresponding to the inputted data word.

6. The apparatus of claim 2 wherein output of the selecting means consists of the output from the first replacement means when there are only two code words W2a and W2a' corresponding to the inputted data word.

7. The apparatus of claim 2 wherein output of the selecting means consists of one of the outputs from the first and second generation means when there are only two code words W2a and W2b corresponding to the inputted data word.

8. The apparatus of claim 2 further comprising:
(a) means for inserting a synchronous pattern allowing block synchronization;
(b) means for dividing the n-bit code word into first and second sub code words;
(c) first preliminary coding means for generating information identifying the first sub code word;
(d) second preliminary coding means for generating information identifying the second sub code word; and
(e) final coding means for deriving a m-bit data word, corresponding to the n-bit code word inputted into the dividing means, from the outputs of the first and second preliminary coding means.

9. The apparatus of claim 8 wherein code words of a first type are used to correspond to data words and code words of a second type are used as synchronous patterns, wherein an absolute value of a difference between a number of bits having a binary value 1 and a number of bits having a binary value 0 is equal to or smaller than 6 in each of the first type code words, and wherein an absolute value of a difference between a number of bits having a binary value 1 and a number of bits having a binary value 0 is equal to or greater than 8 in each of the second type code words.

10. A code conversion apparatus for generating run length limited codes wherein data words are converted into code words which are concatenated to form a bit sequence where a number of successive bits having a same binary value is limited to a preset range, the apparatus comprising:
(a) means for generating a group of signals representing respective code words corresponding to a first data word;
(b) means for generating a signal representing a code word corresponding to a second data word following the first data word; and
(c) means for selecting one of the signals in the group in accordance with only the code word corresponding to the second data word.

* * * * *